United States Patent
Feiweier et al.

(10) Patent No.: US 9,651,644 B2
(45) Date of Patent: May 16, 2017

(54) METHOD AND MAGNETIC RESONANCE SYSTEM TO ACQUIRE MR DATA IN A PREDETERMINED VOLUME SEGMENT OF AN EXAMINATION SUBJECT

(71) Applicants: Thorsten Feiweier, Poxdorf (DE); Christof Krellmann, Erlangen (DE); Bernd Kuehn, Uttenreuth (DE); Dominik Paul, Bubenreuth (DE); Josef Pfeuffer, Kunreuth (DE); Elisabeth Preusche, Erlangen (DE); Katrin Wohlfarth, Erlangen (DE)

(72) Inventors: Thorsten Feiweier, Poxdorf (DE); Christof Krellmann, Erlangen (DE); Bernd Kuehn, Uttenreuth (DE); Dominik Paul, Bubenreuth (DE); Josef Pfeuffer, Kunreuth (DE); Elisabeth Preusche, Erlangen (DE); Katrin Wohlfarth, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1091 days.

(21) Appl. No.: 13/848,965

(22) Filed: Mar. 22, 2013

(65) Prior Publication Data
US 2013/0249550 A1    Sep. 26, 2013

(30) Foreign Application Priority Data
Mar. 22, 2012    (DE) .................. 10 2012 204 624

(51) Int. Cl.
*G01V 3/00* (2006.01)
*G01R 33/563* (2006.01)
(Continued)

(52) U.S. Cl.
CPC ..... *G01R 33/563* (2013.01); *G01R 33/56527* (2013.01); *G01R 33/4833* (2013.01); *G01R 33/4838* (2013.01)

(58) Field of Classification Search
CPC .................................. G01R 33/56527
(Continued)

(56) References Cited

U.S. PATENT DOCUMENTS 9,151,816 B2 * 10/2015 Fautz ............... G01R 33/56545
9,465,093 B2 * 10/2016 Greiser ............ G01R 33/56366
(Continued)

FOREIGN PATENT DOCUMENTS

JP    06070905    3/1994

OTHER PUBLICATIONS

Hwang K.P. et al "Selective Missing Pulse Steady State Free Precession (MP-SSFP): Inner Volume and Chemical Shift Selective Imaging in a Steady Sate Sequence"; Journal of Magnetic Resonance Imaging; vol. 19; pp. 124-132; (2004).
(Continued)

*Primary Examiner* — Louis Arana
(74) *Attorney, Agent, or Firm* — Schiff Hardin LLP

(57) ABSTRACT

In a method and a magnetic resonance (MR) system, a marked area is determined that demarcates a predetermined volume segment of the subject relative to the regions adjacent thereto. Nuclei in the predetermined volume segment are excited, or nuclei in a region adjacent thereto are saturated with an RF excitation pulse at the same time a magnetic field gradient is activated. The center frequency of a frequency range of the RF excitation pulse and the direction of the magnetic field gradient are adjusted dependent on resonant frequencies of substances present within the predetermined volume segment in order, starting from the predetermined volume segment to shift an actual excitation volume segment excited by the RF excitation pulse toward the marked area, or to shift a saturation volume
(Continued)

saturated by the RF excitation pulse away from the marked area. MR data are then acquired from the predetermined volume segment.

18 Claims, 6 Drawing Sheets

(51) Int. Cl.
  *G01R 33/565* (2006.01)
  *G01R 33/483* (2006.01)
(58) Field of Classification Search
  USPC ............................... 324/309, 307, 306, 314
  See application file for complete search history.

(56) References Cited

U.S. PATENT DOCUMENTS

| | | | |
|---|---|---|---|
| 2004/0064035 A1 | 4/2004 | Miyoshi et al. | |
| 2005/0168221 A1 | 8/2005 | Miyoshi | |
| 2010/0219831 A1 | 9/2010 | Greiser et al. | |
| 2010/0272337 A1 | 10/2010 | Shirai et al. | |
| 2012/0025824 A1 | 2/2012 | Harder et al. | |
| 2014/0300357 A1* | 10/2014 | Bachschmidt | G01R 33/5659 324/309 |
| 2015/0130462 A1* | 5/2015 | Paul | G01R 33/56536 324/309 |
| 2016/0084930 A1* | 3/2016 | Paul | G01R 33/4818 324/309 |

OTHER PUBLICATIONS

Henning A. et al. "SELVOS: Brain MRSI Localization Based on Highly SelectiveT1-and B1-Intensitive Outer-Volume Suppression at 3T"; Magn. Reson. Med.; vol. 59; pp. 40-51; (2008).

Pfeuffer et al. "Zoomed Functional Imaging in the Human Brain at 7 Tesla with Simultaneous High Spatial and High Temporal Resolution," NeuroImage, vol. 17 pp. 272-286 (2000).

* cited by examiner

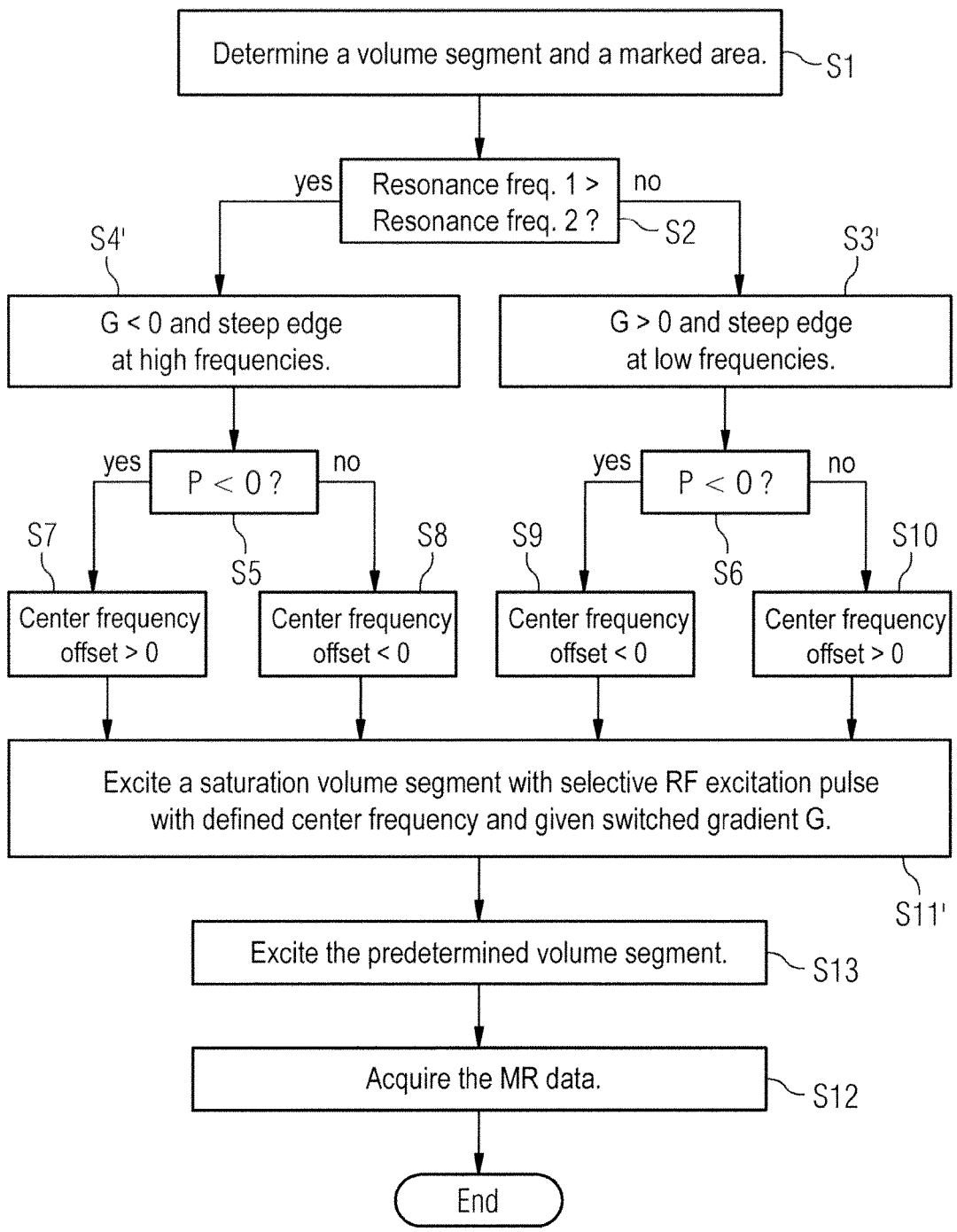

METHOD AND MAGNETIC RESONANCE SYSTEM TO ACQUIRE MR DATA IN A PREDETERMINED VOLUME SEGMENT OF AN EXAMINATION SUBJECT

BACKGROUND OF THE INVENTION

Field of the Invention

The present invention concerns a method and a magnetic resonance (MR) system to acquire MR data in a predetermined volume segment of an examination subject with the magnetic resonance system.

Description of the Prior Art

In both MR imaging and MR spectroscopy, it is often necessary to suppress unwanted signal contributions originating from a defined region, defined regions of the examination subject by suitable measures, or to specifically acquire only signal contributions originating from defined regions of the examination subject. For example, a movement (due to a respiration of the examination subject, for example), a flow or a pulsation (in blood vessels, for example) can lead to artifacts that are not only locally limited to the corresponding region but also are visible in the entire MR image, and thus can lead to a reduced diagnostic quality.

A first possibility to restrict these artifacts, and therefore to improve the quality of the MR images, is to excite the volume segment to be examined but not the disruptively affected region with suitable excitation pulses, such that the signal of the disruptively affected region does not enter into the imaging process. The complete volume segment to be examined should be excited (and thus acquired) by the imaging process.

A second possibility to restrict such artifacts (and therefore to improve the quality of the MR images) is to saturate the magnetization of the nuclear spins in the disruptively affected region by suitable preparation pulses, and to thereby reduce the signal contribution from this region in the subsequent imaging process. The signal from the examination region or from the volume segment to be examined should not be negatively affected by the preparation pulses.

In both possibilities, it must be considered that multiple spin species can be present that exhibit a different chemical shift (for example fat and water protons). In the excitation case (the first possibility), the risk exists that chemically shifted spin species may not be excited in the examination volume. In the saturation case (the second possibility), the risk exists that chemically shifted spin species in the examination volume are suppressed. Both situations lead to a reduced diagnostic quality of the MR images since relevant information is not acquired from the volume segment to be examined, and therefore is missing in the created MR images.

A comparable situation can be present when the basic field of the magnet of the magnetic resonance system is statically or dynamically distorted.

SUMMARY OF THE INVENTION

An object of the present invention is to reduce the consideration that must be given to avoid impairing the signal in the volume segment to be examined, even in the above-described problem cases, and to optimally ensure that the complete volume segment is incorporated into the imaging process.

In accordance with the present invention, a method is provided to acquire MR data in a predetermined volume segment of an examination subject by operation of a magnetic resonance system. The method includes the following steps:

Determine a marked area that demarcates the predetermined volume segment from adjacent regions of the examination subject that adjoin the predetermined volume segment. The marked area accordingly forms a type of boundary area with which the predetermined three-dimensional volume segment or two-dimensional slice-shaped volume segment is bounded (limited) on one side.

Selective excitation of the predetermined volume segment with a one-, two- or three-dimensional selective RF excitation pulse that is radiated simultaneously with at least one magnetic field gradient that is situated essentially orthogonal to the marked area. Essentially orthogonal means that the magnetic field gradient, together with a surface normal of the marked area, enclose an angle of not more than 10° and at best is situated parallel to the surface normal (angle=0°). If the marked area is not a plane or flat surface, a grid can then be placed over the marked area, wherein lines of the grid respectively intersect at the same intervals. At each intersection point of the grid, a surface normal is respectively determined, and the surface normal necessary to determine the angle corresponds to a sum of these multiple surface normals divided by the number of intersection points.

Acquisition of MR data within the predetermined volume segment.

The one-, two- or three-dimensional selective RF excitation pulse limits the volume to be excited in one, two or three dimensions. Given a two-dimensional selective excitation, two magnetic field gradients (selection gradients) typically exist that are situated perpendicularly to one another. Given a three-dimensional selective excitation, three magnetic field gradients situated orthogonally to one another are typically used.

In the method according to the invention, a center frequency of a frequency range of the RF excitation pulse and a direction of the magnetic field gradient are adjusted depending on resonance frequencies of substances that are present within the predetermined volume segment. Through this adjustment, a volume segment that is actually excited by the RF pulse is shifted toward the marked area relative to the predetermined volume segment, and possibly beyond this.

The direction of the magnetic field gradient is represented by the algebraic sign of the magnetic field gradient, depending on whether the magnetic field increases (positive sign) or decreases (negative sign) along a spatial axis. In other words, depending on the resonance frequencies, it is determined whether the magnetic field gradient is directed starting from the predetermined volume segment toward the marked area, or away from the marked area toward the predetermined volume segment.

By the adjustment of the center frequency according to the invention and the direction of the magnetic field gradient, the risk of chemically shifted spin species in the predetermined volume segment not being excited in proximity to the marked area is reduced in comparison to the prior art.

In the case that the predetermined volume segment is a slice, the marked area usually corresponds to a marked edge thereof that normally proceeds in a straight line. Even for the case that the predetermined volume segment is cuboid, the marked area can be viewed as a straight-line edge.

Within the scope of the present invention, a further method is provided to acquire MR data in a predetermined volume segment of an examination subject by means of a magnetic resonance system. This further method comprises the following steps:

In the same manner as in the first method, a marked area is determined which demarcates the predetermined volume segment from adjacent regions of the examination subject that adjoin the predetermined volume segment.

Selective saturation of a saturation volume segment with an RF excitation pulse, wherein at the same time a magnetic field gradient is switched (activated) with the RF excitation pulse, this magnetic field gradient being situated essentially orthogonal to the marked area in the same manner as in the first method. The saturation volume segment and the predetermined volume segment coincide at the marked area so that the marked area forms a type of boundary surface between the saturation volume segment and the predetermined volume segment.

Excitation of the predetermined volume segment.

Acquisition of MR data within the predetermined volume segment.

In the further method according to the invention, the center frequency of the frequency range of the RF excitation pulse with which the saturation volume segment is selectively saturated and the direction of the magnetic field gradient are adjusted depending on resonance frequencies of substances that are present within the predetermined volume segment. An actual saturation volume segment that is saturated with the RF excitation pulse is thereby shifted away from the marked area.

By this adjustment of the center frequency and direction of the magnetic field gradient implemented in the further method according to the invention, the risk of chemically shifted spin species in the predetermined volume segment being suppressed by the radiation of the RF excitation pulse for saturation is reduced in comparison to the prior art.

While the predetermined volume segment (examination region) is selectively excited in the first-described method, in the further method the saturation volume segment is excited in order to be saturated. In the first-described method it is important that, even given chemical shifts, the region up to the marked area is also excited, while in the further method it is important that no actually saturated regions beyond the marked area protrude into the predetermined volume segment.

According to the invention, it is possible to also define multiple marked areas in the event that the user defines (for example) multiple saturation regions that border the predetermined volume segment on two, three or more sides. In this case, this number (two, three or more) of respective RF excitation pulses with a respective magnetic field gradient would need to be radiated or activated correspondingly often.

In an embodiment according to the invention of both the first and second method, a vector is defined which is arranged parallel to the magnetic field gradient and is directed from the marked area to the predetermined volume segment. (In the event that multiple magnetic field gradients are switched for excitation, only one of these magnetic field gradients is situated parallel to this vector.) In this embodiment, the direction of the magnetic field gradients is adjusted depending on the resonance frequency of a primary substance of interest within the predetermined volume segment and on the resonance frequency of a secondary substance of (less) interest within the predetermined volume segment. If the resonance frequency of the secondary substance of interest is lower than the resonance frequency of the primary substance of interest, the direction of the magnetic field gradient is switched counter to the direction of the previously defined vector. In contrast to this, the direction of the magnetic field gradient is switched in the direction of the vector when the resonance frequency of the secondary substance of interest is higher than the resonance frequency of the primary substance of interest.

When the term "parallel" is used in connection with the term "antiparallel", parallel then describes the same direction as a comparison direction while antiparallel describes the direction counter to the comparison direction. In contrast to this, when parallel is not used in connection with antiparallel, parallel then encompasses both the same direction as a comparison direction and the direction counter to the comparison direction.

As will be shown below in detail with reference to the figures, according to this embodiment the adjustment of the direction of the magnetic field gradient in the first method ensures that the actual excited volume segment is shifted from the predetermined volume segment towards the marked area, and possibly beyond this. In the second method, according to this embodiment the adjustment of the direction of the magnetic field gradient ensures that the actual saturated saturation volume segment is shifted away from the marked area, and therefore away from the predetermined volume segment. It is apparent that, given the preceding definition of the vector according to the invention, both the actual excited volume starting from the predetermined volume segment and the actual saturated volume starting from the saturation volume segment are shifted counter to the direction of the vector.

According to a first embodiment, the RF excitation pulse is specifically designed asymmetrically for the first method, which can be achieved by means of a frequency modulation or amplitude modulation, for example. An asymmetrical RF excitation pulse is an RF excitation pulse whose curve has no axis of symmetry with respect to frequency. In this embodiment, in its curve with respect to (versus) frequency the RF excitation pulse has one sharp or steep edge and one edge that runs flat. The asymmetrical RF pulse has only two edges, with one edge proceeding more steeply than the other. According to the invention, the position of the steeper edge of the RF excitation pulse is adjusted depending on the resonance frequencies of the substances present within the predetermined volume segment at high or low frequencies. According to this embodiment, the steeper edge lies at higher frequencies when the resonance frequency of the secondary substance of interest is lower than the resonance frequency of the primary substance of interest. In contrast, the steeper edge lies at lower frequencies when the resonance frequency of the secondary substance of interest is higher than the resonance frequency of the primary substance of interest.

In other words, the frequency curve of the asymmetrical RF excitation pulse has two edges, one of which is steeper than the other. By selecting the frequency position of the steeper edge according to the invention, the steeper edge of the RF excitation pulse coincides with the marked area, such that a sharper separation between the excited volume and an adjacent region takes place in comparison to the edge of the RF excitation pulse with a flat curve.

If the asymmetrical RF excitation pulse is generated by the use of frequency modulation, the frequency sweeps are designed so that the RF pulse energy is predominantly (meaning more than half) divided into lower (higher) frequencies in order to form the steeper edge at low (high) frequencies. Expressed differently, the RF pulse energy is applied at low (high) frequencies in order to form the steeper edge at low (high) frequencies.

According to a second embodiment, a center or a volume focal point of the predetermined volume segment is specifically determined for the first method. In this further embodiment, a center frequency offset of the RF excitation pulse is chosen to be positive or negative depending on the direction of the magnetic field gradient, the direction of the vector and the position of the middle of the predetermined volume segment. The following four possibilities exist:

1. The direction of the magnetic field gradient is antiparallel to the direction of the vector, and the middle of the predetermined volume segment is situated away from the isocenter of the magnetic resonance system in the direction of the vector:
the center frequency offset is negative.
2. The direction of the magnetic field gradient is antiparallel to the direction of the vector, and
the middle of the predetermined volume segment is situated away from the isocenter of the magnetic resonance system, counter to the direction of the vector:
the center frequency offset is positive.
3. The direction of the magnetic field gradient is parallel to the direction of the vector, and
the middle of the predetermined volume segment is situated away from the isocenter of the magnetic resonance system, in the direction of the vector:
the center frequency offset is positive.
4. The direction of the magnetic field gradient is parallel to the direction of the vector, and
the middle of the predetermined volume segment is situated away from the isocenter of the magnetic resonance system, counter to the direction of the vector:
the center frequency offset is negative.

The center frequency offset is added to the resonance frequency of the primary substance of interest to determine the center frequency of the RF excitation pulse.

In the method according to the invention, the adjustment of the center frequency offset depending on the direction of the magnetic field gradient and the position (of the center) of the predetermined volume segment relative to the isocenter ensures that the actual volume segment excited by the RF pulse is shifted away from the predetermined volume segment in the direction of the marked area, and beyond this under the circumstances.

According to a first embodiment, for the second method the RF excitation pulse is formed asymmetrically in the same manner as in the first embodiment of the first method. In the same way as in the first method, in this embodiment of the second method the steep edge of the RF excitation pulse is formed independently of whether the resonance frequency of the primary substance of interest is higher or lower than the resonance frequency of the secondary substance of interest given (comparably) high or (comparably) low frequencies. According to this embodiment, the steeper edge of the RF excitation pulse is formed at low frequencies when the resonance frequency of the secondary substance of interest is lower than the resonance frequency of the primary substance of interest. In contrast to this, the steeper edge is formed at higher or high frequencies when the resonance frequency of the secondary substance of interest is higher than the resonance frequency of the primary substance of interest.

As in the first embodiment of the first method, in the first embodiment of the second method the steeper edge of the RF excitation pulse coincides with the marked area, such that a sharp separation is achieved between the saturated volume and the predetermined volume segment.

In a second embodiment of the second method, the center frequency offset of the RF excitation pulse is adjusted positively or negatively depending on the direction of the magnetic field gradient, the direction of the vector and the position of a volume segment, in the same manner as in the second embodiment of the first method. In contrast to the second embodiment of the first method, however, this time it is the center or the volume focal point of the saturation volume segment. The following four possibilities thereby exist again:

1. The direction of the magnetic field gradient is antiparallel to the direction of the vector, and
the middle of the saturation volume segment lies away from the isocenter in the direction of the vector:
the center frequency offset is negative.
2. The direction of the magnetic field gradient is antiparallel to the direction of the vector, and
the middle of the saturation volume segment lies away from the isocenter, counter to the direction of the vector:
the center frequency offset is positive.
3. The direction of the magnetic field gradient is parallel to the direction of the vector, and
the middle of the saturation volume segment lies away from the isocenter in the direction of the vector:
the center frequency offset is positive.
4. The direction of the magnetic field gradient is parallel to the direction of the vector, and
the middle of the saturation volume segment lies away from the isocenter, counter to the direction of the vector:
the center frequency offset is negative.

In the second method according to the invention, the adjustment of the center frequency so as to be offset depending on the direction of the magnetic field gradient and the position (the middle) of the saturation volume segment with regard to the isocenter, ensures that the actual saturation volume segment that is excited by the RE excitation pulse, and is thereby saturated, is shifted away from the predetermined volume segment. This reduces the risk of regions of the predetermined volume segment being incorrectly saturated.

Since the direction of the magnetic field gradient is established depending on whether the resonance frequency of the primary substance of interest is higher or lower than the resonance frequency of the secondary substance of interest, the condition "the direction of the magnetic field gradient is parallel to the direction of the vector" is replaced with the condition "the resonance frequency of the primary substance of interest is lower than the resonance frequency of the secondary substance of interest". In the same way, the condition "the direction of the magnetic field gradient is antiparallel to the direction of the vector" is replaced with the condition "the resonance frequency of the primary substance of interest is higher than the resonance frequency of the secondary substance of interest". This applies to the first and second method.

According to one embodiment of both the first and second methods, the marked area is graphically presented to a user of the magnetic resonance system. The user is then in the position to modify the position and/or the shape of the marked area via the operation of corresponding control elements of the magnetic resonance system.

With this embodiment, the user can displace and/or design the marked area as he or she desires. The user thereby influences the actual excited volume segment and/or the actual saturated saturation volume segment according to his reasons.

Moreover, in both the first and second methods, it is possible to automatically detect anatomical properties of the examination subject, and to subsequently determine the predetermined volume segment and the marked area depending on these detected anatomical properties.

To automatically determine the predetermined volume segment and the marked area, information from automatic anatomical registration methods ("auto-align") can be used, Algorithms are thereby used which can identify and adjust anatomical information in the acquired MR image on the basis of landmarks or atlases. The position and orientation of the saturation volume segment and the predetermined volume segment, as well as the shape and position of the marked area, can be established automatically via these methods. This approach is suitable both to avoid artifacts due to a chemical shift and due to static or dynamic field disruptions.

It is also possible to positively switch the magnetic field gradients in a first data acquisition (test) and to negatively switch the magnetic field gradients in a second data acquisition. In other words, the direction of the magnetic field gradient in the first data acquisition is antiparallel to the direction of the magnetic field gradient in the second data acquisition. For each of the two data acquisitions, the pixel values are acquired for those pixels that have incorrectly not been excited in the predetermined volume segment, or that have been incorrectly saturated in the predetermined volume segment. A weighted mean value of these pixel values is determined. For example, the weighting can take place with the amplitude of the pixels by the weighting being set to be greater the higher the amplitude. Another possibility is to use only pixel values that exceed a predetermined threshold to determine the weighted mean value. The magnetic field gradient is thereby positively switched when the weighted mean value in the first data acquisition is smaller than in the second data acquisition. In the other case, the magnetic field gradient is negatively switched.

Moreover, in a variant according to the invention, already-present information about the static field disruptions (and possibly also about the dynamic field disruptions that are to be expected) can be used to determine the direction of the magnetic field gradient. For example, an adjustment measurement for a patient-dependent adjustment of the magnetic field homogeneity ("B0 shim") is implemented before the beginning of the actual diagnostic acquisition of MR data in order to determine the current B0 field distribution. The complete information about the static field disruptions is thereby determined, from which the direction of the magnetic field gradients can be determined (without additional measurement). Comparable adjustment measurements of dynamic field disruptions are likewise possible, wherein at least a portion of the measurement workflow of the actual diagnostic measurements would need to be simulated, however.

The previously described first and second data acquisitions could be simulated to determine the direction of the magnetic field gradient. The magnetic field gradient would then be switched positively if the weighted mean value calculated by means of simulation were to turn out to be smaller in the first test than in the second test. In the other case, the magnetic field gradient would be switched negatively.

To acquire MR data in the predetermined volume segment, after the determination of the marked area for selective excitation of the predetermined volume segment, or for selective saturation of the saturation volume segment and excitation of the predetermined volume segment with the RF excitation pulse, the corresponding magnetic field gradient could be switched.

The described variant essentially represents a separate invention which is independent of the first or second method according to the invention since this variant has no dependency on the substances present in the predetermined volume segment.

In accordance with the present invention, a first magnetic resonance system is provided to acquire MR data in a predetermined volume segment of an examination subject. The magnetic resonance system has a basic field magnet; a gradient field system; at least one RF transmission antenna; at least one reception coil element; and a control device. The control device serves to control the gradient field system and the at least one RF transmission antenna. The control device is designed in order to receive measurement signals that have been received by the at least one reception coil element, and in order to evaluate these acquired measurement signals and generate corresponding MR data. The magnetic resonance system is designed to determine a marked area that demarcates the predetermined volume segment from regions of the examination subject that adjoin the predetermined volume segment. The magnetic resonance system excites the predetermined volume segment selectively with a one-, two- or three-dimensional RF excitation pulse, with at least one magnetic field gradient, this is essentially orthogonal to the marked area, being simultaneously activated. The magnetic resonance system subsequently acquires MR data within the predetermined volume segment. The magnetic resonance system adjusts the center frequency of a frequency range of the RF excitation pulse an a direction of the magnetic field gradient depending on resonance frequencies of substances which are to be acquired within the predetermined volume segment. A volume segment that is actually excited by the RF excitation pulse is thereby shifted from the predetermined volume segment in the direction of the marked area, and possibly beyond this.

The present invention also encompasses a second magnetic resonance system is also provided to acquire MR data in a predetermined volume segment of an examination subject. The magnetic resonance system has a basic magnetic field; a gradient field system; at least one RF transmission antenna; at least one reception coil element; and a control device. The control device serves to control the gradient field system and the at least one RF transmission antenna. The control device is designed in order to receive measurement signals that have been received by the at least one reception coil element, and in order to evaluate these acquired measurement signals and generate corresponding MR data. The magnetic resonance system is designed in order to determine a marked area that demarcates the predetermined volume segment from regions of the examination subject that adjoin the predetermined volume segment. The magnetic resonance system selectively saturates at least one saturation volume segment (that adjoins the marked area at the predetermined volume segment) with an RF excitation pulse, with a magnetic field gradient, essentially orthogonal to the marked area, being simultaneously activated. The magnetic resonance system excites the predetermined volume segment and acquires MR data within the predetermined volume segment. The magnetic resonance system thereby adjusts the center frequency of the frequency range of the RF excitation pulse and a direction of the magnetic field gradient depending on resonance frequencies of substances which are to be acquired within the predetermined volume segment in order to thereby shift an actual saturation volume segment that is saturated with the aid of the RF excitation pulse away from the marked area.

The advantages of the two magnetic resonance systems according to the invention essentially correspond to the advantages of the respective methods according to the invention that have been described in detail above.

The present invention also encompasses a non-transitory, computer-readable data storage medium encoded with programming instructions that can be loaded into a memory of a programmable control device or a computer of a magnetic resonance system. All or various embodiments of the methods according to the invention that are described in the preceding can be implemented when the programming instructions are executed in the control device. The programming instructions may require other program means—for example libraries and auxiliary functions—in order to realize the corresponding embodiments of the methods. The programming instructions can be source code (C++, for example) that must still be compiled and linked or that only must be interpreted, or an executable software code that has only to be loaded into the corresponding computer or control device for execution.

The electronically readable data storage medium can be a DVD, a magnetic tape or a USB stick, for example.

The present invention is suitable both for MR imaging and MR spectroscopy. It is explicitly noted that, according to the invention, the first method and the second method can be used in combination so that, for MR data acquisition, the predetermined volume segment is selectively excited according to the first method and the saturation volume segment is selectively saturated according to the second method. A magnetic resonance system can also similarly have the properties or, respectively, features of the first and second magnetic resonance system.

BRIEF DESCRIPTION OF THE DRAWINGS

FIG. 11 shows an embodiment of the second method according to the invention in the form of a flowchart.

DESCRIPTION OF THE PREFERRED EMBODIMENTS

Figure 1:
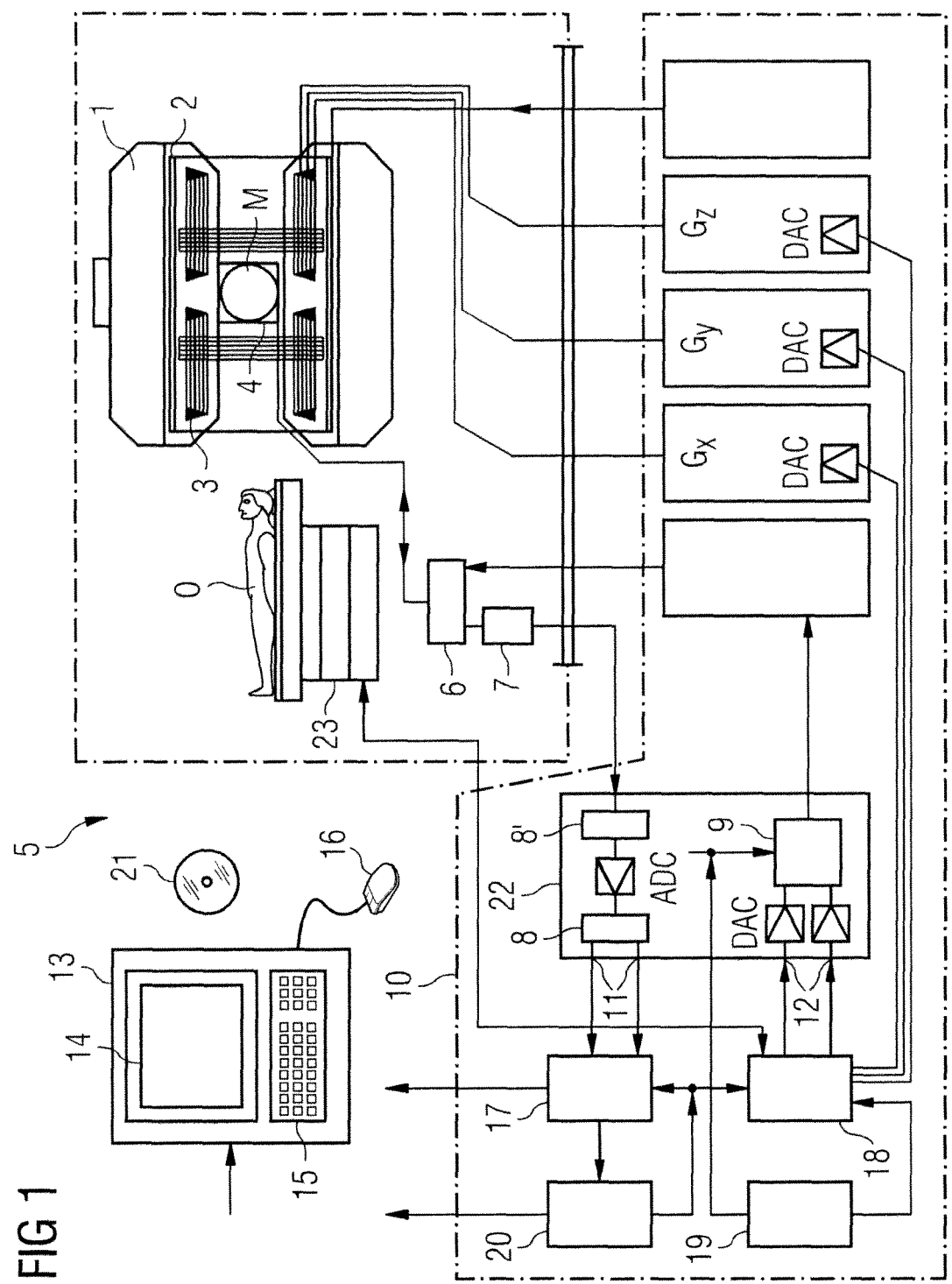
FIG. 1 depicts a magnetic resonance system according to the invention.

FIG. 1 shows a schematic presentation of a magnetic resonance system 5 (of a magnetic resonance imaging or nuclear magnetic resonance tomography apparatus). A basic field magnet 1 generates a temporally constant, strong magnetic field for polarization or alignment of the nuclear spins in a volume segment of a subject O (for example of a part of a human body that is to be examined). The subject O, lying on a table 23, is driven into the magnetic resonance system 5 for examination or measurement (data acquisition). The high homogeneity of the basic magnetic field that is required for the magnetic resonance measurement is defined in a typically spherical measurement volume M in which the parts of the human body that are to be examined are located. Shim plates made of ferromagnetic material are mounted at a suitable location to support the homogeneity requirements, and in particular to eliminate temporally invariable influences.

A cylindrical gradient coil system 3 having three sub-windings is inserted into the basic field magnet 1. Each sub-winding is supplied with current by an amplifier to generate a linear (also temporally variable) gradient field in the respective directions of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each amplifier includes a digital/analog converter that is controlled by a sequence controller 18 for time-accurate generation of gradient pulses.

Located within the gradient field system 3 are one or more radio-frequency antennas 4 that convert the radio-frequency pulses emitted by a radio-frequency power amplifier into an alternating magnetic field to excite the nuclei and "flip" the nuclear spins of the subject O to be examined, of the region of the subject O that is to be examined. Each radio-frequency antenna 4 has one or more RF transmission coils and multiple RF reception coil elements in the form of an annular—advantageously linear or matrix-shaped—arrangement of component coils. The alternating field emanating from the precessing nuclear spins—i.e. normally the nuclear spin echo signals caused by a pulse sequence composed of one or more radio-frequency pulses and one or more gradient pulses—is also converted by the RF reception coil elements of the respective radio-frequency antenna 4 into a voltage (measurement signal). This voltage is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are represented digitally in the sequence controller as a series of complex numbers based on a pulse sequence provided by the system computer 20. This number sequence is supplied as a real part and imaginary part via respective inputs 12 to a digital/analog converter in the radio-frequency system 22, and from this to a transmission channel 9. In the transmission channel 9, the pulse sequences are modulated on a radio-frequency carrier signal whose base frequency corresponds to the center frequency.

The switching from transmission operation to reception operation takes place via a transmission/reception diplexer 6. The RF transmission coils of the radio-frequency antenna 4 radiate the radio-frequency pulses to excite the nuclear spins into the measurement volume M, and resulting echo signals are sampled via the RF reception coil elements. The correspondingly acquired magnetic resonance signals are phase-sensitively demodulated to an intermediate frequency in the reception channel 8 (first demodulator) of the radio-frequency system 22 and are digitized in the analog/digital converter (ADC). This signal is further demodulated to a frequency of 0. The demodulation to a frequency of 0 and the separation into real part and imaginary part take place in a second demodulator 8 in the digital domain after the digitization. An MR image or three-dimensional image data set is reconstructed by an image computer 7 from the measurement data acquired in such a manner. The administration of the measurement data, the image data and the control programs takes place via the system computer 20. Based on a specification with control programs, the sequence controller 18 monitors the generation of the respective desired pulse sequences and the corresponding sampling of k-space. In particular, the sequence controller 18 controls the time-accurate switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR image (which control programs are stored on a DVD 21, for example) and the presentation of the generate MR image take place via a terminal 13 that has a keyboard 15, a mouse 16 and a monitor 14.

Figure 2:
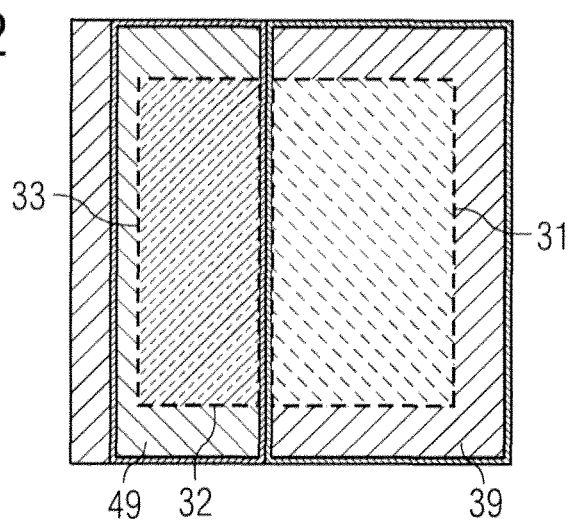
FIG. 2 shows a predetermined volume segment and a saturation volume segment of an examination subject.

In FIG. 2 an examination volume 33 is shown that is subdivided into a predetermined volume segment 31 and a saturation volume segment 32.

In order to suppress signal portions from specific regions in MR imaging and in MR spectroscopy, the signal from a volume 49 (or from multiple volumes) to be saturated that is defined by a user is excited with one (or more) spatially selective RF excitation pulse, and the transverse magnetization that is generated in such a manner is subsequently dephased by what are known as spoiler gradient pulses. The RF excitation pulse of the immediately following imaging module then acquires only spins from the predetermined volume segment, such that only this predetermined volume segment supplies imaging signal contributions. The RF excitation pulse of the imaging module can thereby be designed to be spatially selective or not spatially selective. In FIG. 2 the volume 39 is excited by the RF excitation pulse of the imaging module.

The predetermined volume segment 31 and the saturation volume segment 32 are parts of the volume 33 of the subject that is to be examined. In contrast to this, the volume to be saturated or the saturation region 49 includes the saturation volume segment 32 but is larger than this in order to optimally saturate the entire saturation volume segment 32 even given interference (for example magnetic field fluctuations). In the same manner, the volume 39 to be excited includes the predetermined volume segment 31 but is larger than this in order to optimally excite the entire predetermined volume segment 31 even given interference.

The saturation volume segment 32 or the volume 49 to be saturated can have the shape of a slice which is defined by the spatial attitude (position and orientation) and by the slice thickness. More complex geometries (for example curved slices) can also be realized with the use of more complicated excitation methods (for example via use of 2D or 3D RF excitation pulses) in order to follow an anatomy of the examination subject that is to be suppressed.

Figure 3A:
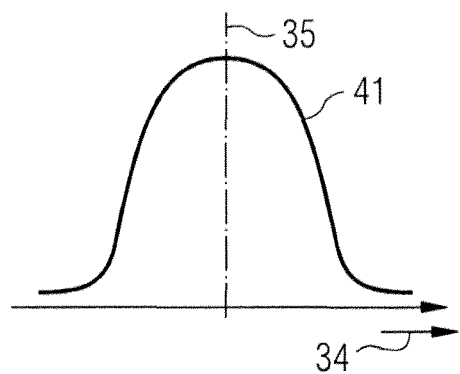
FIGS. 3a and 3b show a symmetrical RF excitation pulse and an asymmetrical RF excitation pulse are depicted.

For the regional saturation (i.e. a suppression of the signal portions from the saturation volume segment 32), symmetrical RF excitation pulses can be used which are simultaneously used with a constant slice selection gradient G. These symmetrical RF excitation pulses 41 have a symmetrical profile in positional space as it is shown in FIG. 3a. the curve of the symmetrical RF excitation pulse 41 along the frequency 34 or in the direction of the magnetic field gradient is symmetrical to an axis of symmetry 35.

To reduce the SAR ("Specific Absorption Rate"), according to the invention selection gradients can also be used with a variable amplitude; see VERSE ("Variable-Rate Selective Excitation").

Figure 3B:
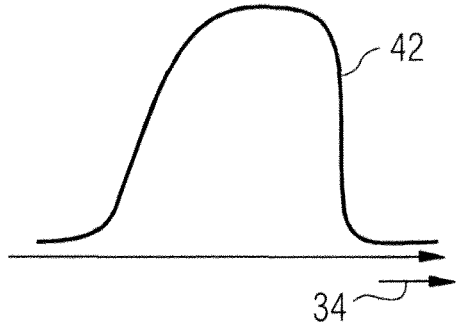

Alternatively, asymmetrical RF excitation pulses 42 can be used within the scope of the present invention. An asymmetrical RF excitation pulse 42 has an asymmetrical profile in positional space with a very sharply defined edge or slope (to the right in FIG. 3b) and a less sharply defined slope (to the left in FIG. 3b). This means that, given an asymmetrical RF excitation pulse, the curve of the RF excitation pulse 42 along the frequency 34, or in the direction of the magnetic field gradient, has no axis of symmetry 35. By the use of frequency-modulated asymmetrical RF excitation pulses (for example "adiabatic" RF excitation pulses), the acquisition of the MR data is more robust against variations of what is known as the flip angle of the RF excitation pulse which, for example, can occur due to RF inhomogeneities in the high-field imaging.

In addition or as an alternative to the regional saturation of the regions with unwanted signal contributions, according to the invention a targeted selective excitation of the examination region or of the predetermined volume segment can be used. The selective excitation can also function with either a symmetrical RF excitation pulse 41 or with an asymmetrical RF excitation pulse 42. By using 2D-selective RF excitation pulses or (in the case of multiple RF excitation pulses participating in the imaging process, for example given spin echo methods) multiple 1D-selective RF excitation pulses with slice selection gradients in different directions, the excitation profile can not only be developed along the slice normal but can also limit the imaging region in an asymmetrical manner within the slice plane. Moreover, the use of 3D-selective RF excitation pulses is also conceivable. In general, the use of magnetic field gradients along the corresponding axes (thus along two or three axes given 2D-selective or 3D-selective RF excitation pulses) is necessary for each spatial dimension.

It is noted again that the regional saturation (second method) and the selective excitation (first method) can be combined according to the invention.

According to the prior art, it is a problem that the suppression regions (i.e. the saturation volume segments 32) do not coincide for spins with different chemical shift (for example fat and water), and there is no possibility for the user to exert influence. According to the prior art, the magnetic resonance system is designed such that the saturation volume segment 32 coincides with the actual saturated volume segment for the most relevant chemical species (i.e. normally for water). Depending on the spatial attitude of the saturation volume segment 32 relative to the isocenter of the magnetic resonance system and direction of the magnetic field gradient, the situation can thereby occur that the actual saturated volume segment for other spin species (for example for fat) extends into the predetermined volume segment 31 (the examination volume), whereby a portion of the image information required for the diagnosis is lost.

Figure 4:
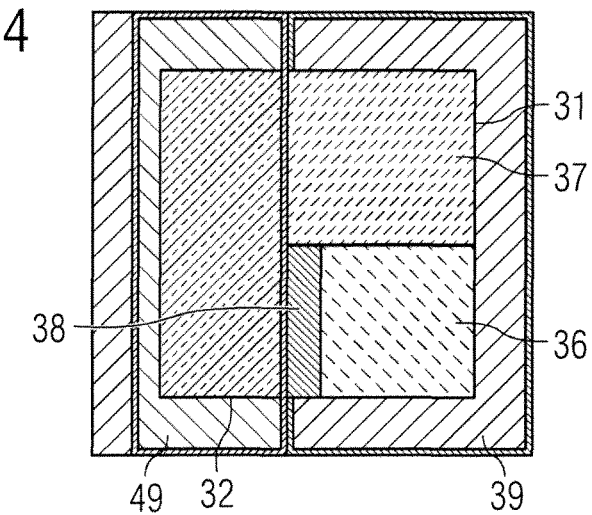
FIG. 4 shows a negative case in which a fat signal within the predetermined volume segment is saturated according to the prior art.

In the negative case shown in FIG. 4, the actual volume saturated with regard to fat protrudes into the predetermined volume segment 31, such that the volume segment labeled with the reference character 38 in FIG. 4 is saturated with regard to a fat signal within the predetermined volume segment 31, for example, such that after the saturation only the volume segment 36 in the predetermined volume segment 31 supplies a fat signal. Since the boundary of the saturation volume segment 32 with the predetermined volume segment 31 coincides with the boundary of the actual saturated volume with the predetermined volume segment 31 with regard to water, the entire predetermined volume segment 31 delivers a water signal as it is presented using the volume labeled with the reference character 37 in FIG. 4.

Figure 5:
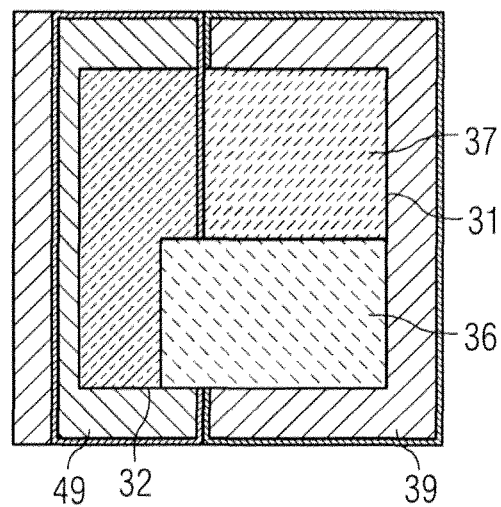
FIG. 5 shows a positive case in which the fat signal in the predetermined volume segment is completely detected, as is the case according to the invention.

The situation is presented better in the positive case shown in FIG. 5. In this case, the actual volume in which the fat nuclei magnetization is saturated is shifted to the left relative to the saturation volume segment 32 in FIG. 5, such that the fat signal 36 is acquired not only from the predetermined volume segment 31 but also in part from the saturation volume segment 32. The fat signal in the predetermined volume segment 31 is thereby completely detected. The situation with regard to the case shown in FIG. 4 does not change with regard to the water signal 37.

As in the regional saturation, the selective excitation can also lead to a positive case or a negative case. In the negative case, the actual excited volume shifts to the right (see FIG. 4 or 5) with regard to the fat signal so that no fat signal can be detected in a left region of the predetermined volume segment 31. In contrast to this, in the positive case the actual excited volume shifts to the left with regard to the fat signal (see FIG. 4 or 5) so that, in this case, the fat signal can be detected from the entire predetermined volume segment 31.

According to the invention, the magnetic resonance system is now respectively adjusted both in the regional saturation and in the selective excitation such that the positive case (and not the negative case) arises.

It is noted that—in addition to the chemical shift—other causes can also be responsible for a deviation between the saturation volume segment and the actual saturated volume, or the predetermined volume segment 31 and the actual excited volume. Every effect that leads to a variation of the precision frequency thereby leads in the same manner to a shift of the actual saturated volume or the actual excited volume. Among such effects are, for example, (local) static BO field distortions due to (local) susceptibility differences or also (local) dynamic BO field distortions due to eddy current effects. In contrast to the chemical shift that leads to a constant shift with a defined algebraic sign in the entire examination volume, the other effects generally influence shifts depending on the position (i.e. changes in the amplitude and in the algebraic sign).

By an appropriate selection of the RF excitation pulse (in particular of the frequency range of the RF excitation pulse) and the slice selection gradient (in particular the direction or the algebraic sign of the slice selection gradient or magnetic field gradient), according to the invention, it is possible to specifically select the direction in which the saturation region (the actual saturated volume) of the secondary spin species is shifted or the direction in which the actual excited volume of the secondary spin species is shifted. It is not significant whether symmetrical or asymmetrical RF excitation pulses are used for saturation or excitation. Given use of asymmetrical RF excitation pulses, it is moreover possible to simultaneously, specifically shift the saturation region of the secondary spin species away from the marked area (marked, sharp edge), or to shift the actual excited volume of the secondary spin species toward the marked area (and possibly beyond).

In the presentation of the saturation region within the scope of the graphical slice positioning (GSP), the marked area or edge that directly adjoins the examination region or the predetermined volume segment can be depicted. Alternatively, the marked area can be represented as a boundary of a selective excitation volume (predetermined volume segment) within the scope of the graphical slice positioning, with this boundary directly adjoining the region (the saturation volume segment) to be excluded from the imaging. Through the presentation of the marked area or edge that is marked in the measurement, this is clearly indicated to the user before the measurement. The user is thus given the possibility to modify the marked area indicated within the scope of the graphical slice positioning according to his wishes.

The marked area 40 can be represented as a marked edge 40 in the graphical slice positioning, this marked edge 40 being emphasized relative to other edges or lines by a specific color, line shape or line thickness. Moreover, it is conceivable to use a corresponding marking in the area of the saturation region 49 in order to emphasize the marked edge 40. With suitable operating elements (for example a mouse), the saturation region 49 can be shifted and rotated within the scope of the graphical slice positioning, whereby the marked edge 40 is accordingly moved as well. It is also possible for parameters that describe the attitude and the orientation of the saturation region 49 and the marked edge 40 to be manipulated directly by the operator by means of the operator entering corresponding numerical values. An exchange of the marked edge 40 for an edge that is not marked (for example the edge of the saturation region 49 that is opposite the marked edge) can also be done by a corresponding change of parameters or via specific interaction in the graphical slice positioning.

Figure 6:
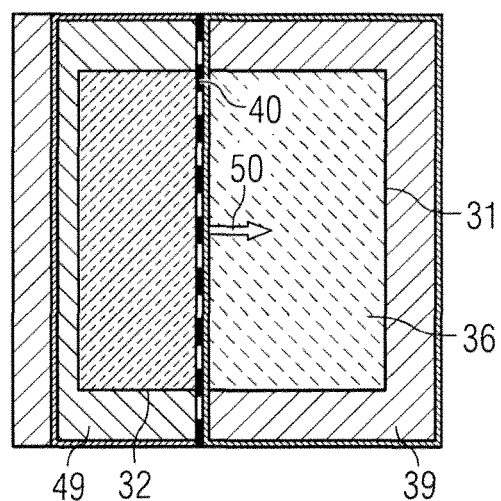
FIG. 6 shows a marked area or edge that demarcates the predetermined volume segment from the saturation volume segment.

In FIG. 6, the marked edge is labeled with the reference character 40 and separates the excitation region 39 from the saturation region 49, and therefore also the predetermined volume segment 31 from the saturation volume segment 32. Moreover, a normal vector 50 of the marked area 40 is shown that is directed from the marked area 40 in the direction of the predetermined volume segment 31.

It is noted that the marked area or edge 40 can be viewed as both a boundary of the saturation region or saturation volume 32 and as a boundary of a selective excitation volume, such that the marked area 40 can be viewed as a starting point of both the first method (and the first magnetic resonance system) and the second method (and the second magnetic resonance system).

The marked area can now be used in order to influence the saturation volume segment or the predetermined volume segment to be excited for a secondary substance of interest (which has a chemical shift relative to the primary substance of interest) in a dedicated manner. For example, the saturation volume segment of the secondary chemical species can be specifically shifted away from the marked area in order to avoid the suppression of signal portions of the secondary species in the predetermined volume segment 31. Moreover, the marked area can simultaneously or alternatively be used in order to specifically place the steep edge of an asymmetrical RF excitation pulse for saturation or excitation.

The marked area 40 can also be used in order to influence the saturation volume segment or the predetermined volume segment to be excited in a dedicated manner given static or dynamic BO field distortions. For example, the saturation volume segment can be specifically shifted away from the marked area 40 for a number of off-resonant spins (spins with a different resonance frequency than the resonance frequency of the primary substance of interest, in particular water) in order to reduce the suppression of signal portions of the off-resonant spins in the predetermined volume segment.

Chemically shifted spin species are represented in the frequency spectrum by a respective line with a respective center frequency that is different for the different spin species. For example, the frequency of most fat protons is shifted by 3.3 ppm to lower frequencies relative to the frequency of the water protons.

Figure 7:
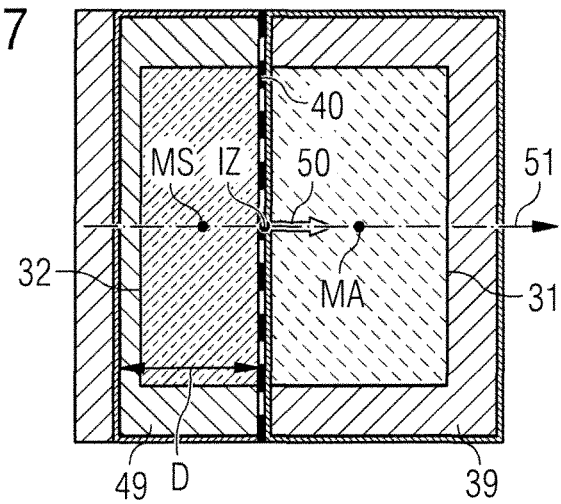
FIG. 7 illustrates the position of the predetermined volume segment and the position of the saturation volume segment relative to the isocenter.

In FIG. 7, the case presented in FIG. 6 is depicted with more detail. In FIG. 7 the isocenter IZ lies directly on the marked edge 40. The magnetic field gradient extends in parallel (or antiparallel), and therefore in the same direction (or counter to this direction) as the normal vector 50 of the marked area 40. The middle or the volume focal point of the saturation region 49 is labeled with the reference character MS, and the middle or volume focal point of the selective excitation region 39 is labeled with the reference character MA. The saturation region 39—which here has the form of a slice of the thickness D—is now excited with a symmetrical RF excitation pulse with the center frequency offset F and the bandwidth BW, wherein a constant slice selection gradient of amplitude G is simultaneously switched in the direction of the slice normal 50. The marked edge 40 is established by the direction of the normal vector 50. The position of the middle MS of the saturation region can be clearly defined as a coordinate on an axis 51 parallel to the slice normal 50 which runs through the isocenter IZ. The polarity (the algebraic sign) of the slice selection gradient is likewise clearly defined with reference to the normal vector 50. The algebraic sign is positive (G>0) when the magnetic field of the slice selection gradient increases in the direction of the normal vector 50, and negative (G<0) when the magnetic field of the slice selection gradient decreases in the direction of the normal vector 50.

The center frequency offset F, the gradient amplitude G and the position P of the middle MS of the saturation region 49 coincide via the following Equation (1), wherein γ is the gyromagnetic ratio.

$$\gamma \times P \times G = 2\pi \times F \quad (1)$$

The center frequency offset F represents the frequency offset of the center frequency of the frequency range of the RF excitation pulse 41 or 42. This frequency offset relates to the resonance frequency of the dominant spin species, with the resonance frequency being determined without application of patient fields (of the magnetic field gradient G). In other words: the center frequency can be calculated via the sum of the resonance frequency of the dominant spin species and the frequency offset. In the first method, the dominant spin species is that species among the present spin species which is primarily to be excited in the predetermined volume segment. In both cases, the dominant spin species is respectively water.

If G is set to +5 mT/m, according to the above equation it results for F that F=21.2 kHz in order to excite a slice centered around the position P=100 mm (100 mm from the isocenter in the direction of the normal vector). In contrast to this, if G=−2 mT/m, then it results from the above Equation (1) that F=−8.5 kHz to excite the slice centered around the position P=100 mm. As soon as the polarity (the algebraic sign) of the magnetic field gradient G and the attitude of P are certain, the polarity to be used (the algebraic sign) of the center frequency offset F can thus be determined.

Two solutions exist both for the case P>0
1. G>0 and F>0
2. G<0 and F<0
and for the case P<0
1. G<0 and F>0
2. G>0 and F<0.

According to the invention, that of the two solutions which leads to the desired saturation response of the two spin species (positive case in FIG. 5) can therefore be specifically selected. The relative shift of the saturation region 49 thereby depends on the polarity of the selection gradient. While the saturation region 49 of the species with a lower frequency is shifted counter to the slice normal 50 for G<0, this saturation region 49 of the species with the lower frequency is shifted with the slice normal 50 for G>0.

According to the invention, for P>0 it therefore follows that G<0 and F<0 are selected, while for P<0 it follows that G<0 and F>0 are selected insofar as the secondary spin species has a lower frequency than the primary.

Figure 8:
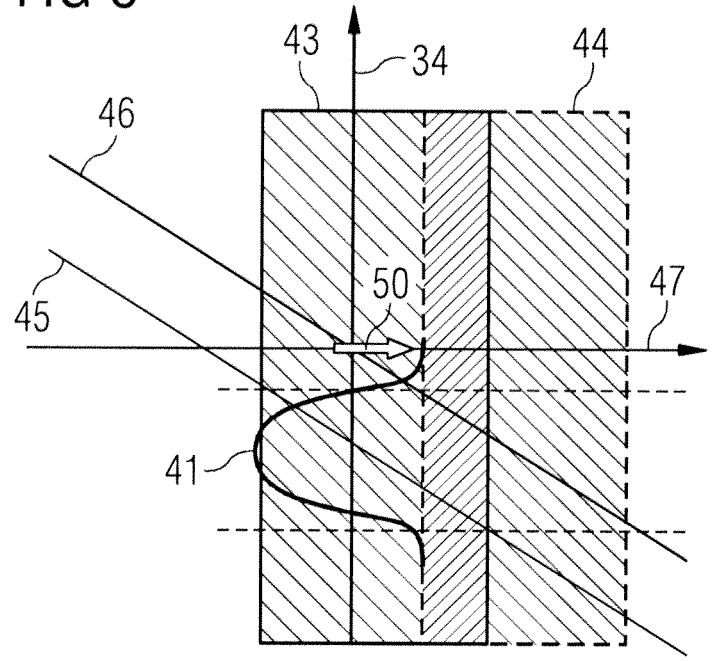
FIG. 8 shows a region saturated with regard to fat and a region saturated with regard to water are shown together with a symmetrical RF pulse.

A saturation region for fat 43 and a saturation region for water 44 are shown in FIG. 8 for the case that the magnetic field gradient is directed opposite the surface normal 50 (meaning that G<0). The straight line 45 represents the resonance frequency of fat at the given position 47, while the straight line 46 represents the resonance frequency of water at the given position 47. The saturation region for fat 43 overlaps the saturation region for water 44 for the given symmetrical RF excitation pulse 41.

If an asymmetrical RF excitation pulse 42 is used instead of a symmetrical RF excitation pulse 41, for each of the previously indicated solutions it can then advantageously be further determined whether the sharp edge of the saturation region is arranged in the direction of the normal vector 50 or opposite this direction.

If the sharp edge of the saturation region should coincide with the marked edge 40, and if the spin species with the lower resonance frequency should simultaneously be shifted counter to the slice normal 50, according to the invention it follows for P>0 that G<0, F<0, and the steep edge of the RF excitation pulse situated at a low frequency (meaning that the RF pulse energy is predominantly distributed at lower frequencies) are chosen, while for P<0 it follows that G<0, F>0 and the steep edge of the RF excitation pulse situated at low frequency (meaning that the RF pulse energy is predominantly distributed at lower frequencies) are chosen. In other words: according to the invention, the steep edge of the RF excitation pulse lies at low frequencies, independent of whether the middle of the saturation region 49 is separated from the isocenter IZ in the direction of the normal vector 50 or opposite the direction of the normal vector 50.

Figure 9:
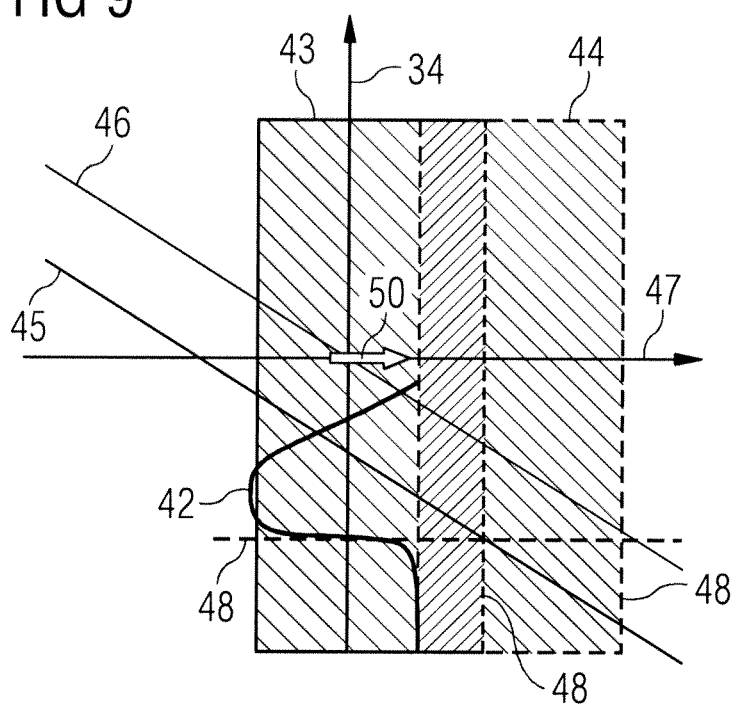
FIG. 9 shows a region saturated with regard to fat and a region saturated with regard to water are shown together with an asymmetrical RE pulse.

While a symmetrical RF excitation pulse 41 is used for saturation in FIG. 8, in FIG. 9 an asymmetrical RF excitation pulse 42 is used in this regard. With no limitation as to generality, this asymmetrical RF exposure offers the possibility that the saturation region for fat 43 or 44 has a sharp edge 48 due to a corresponding design of the asymmetrical RF excitation pulse 42, this sharp edge 48 coinciding with the marked edge 40.

FIGS. 8 and 9 describe the saturation case (the second method). The excitation case is similar to the saturation case, only now the predetermined volume segment 31 is excited with an RF excitation pulse 41 or 42. A difference exists given the use of an asymmetrical RF excitation pulse 42, since the steep edge of the RF excitation pulse 42 must lie on the other side in comparison to the saturation case so that the sharp edge 48 coincides with the marked area 40. The marked edge 40 lies to the right as viewed from the saturation volume segment, while it lies to the left as viewed from the predetermined volume segment 31.

Figure 10:
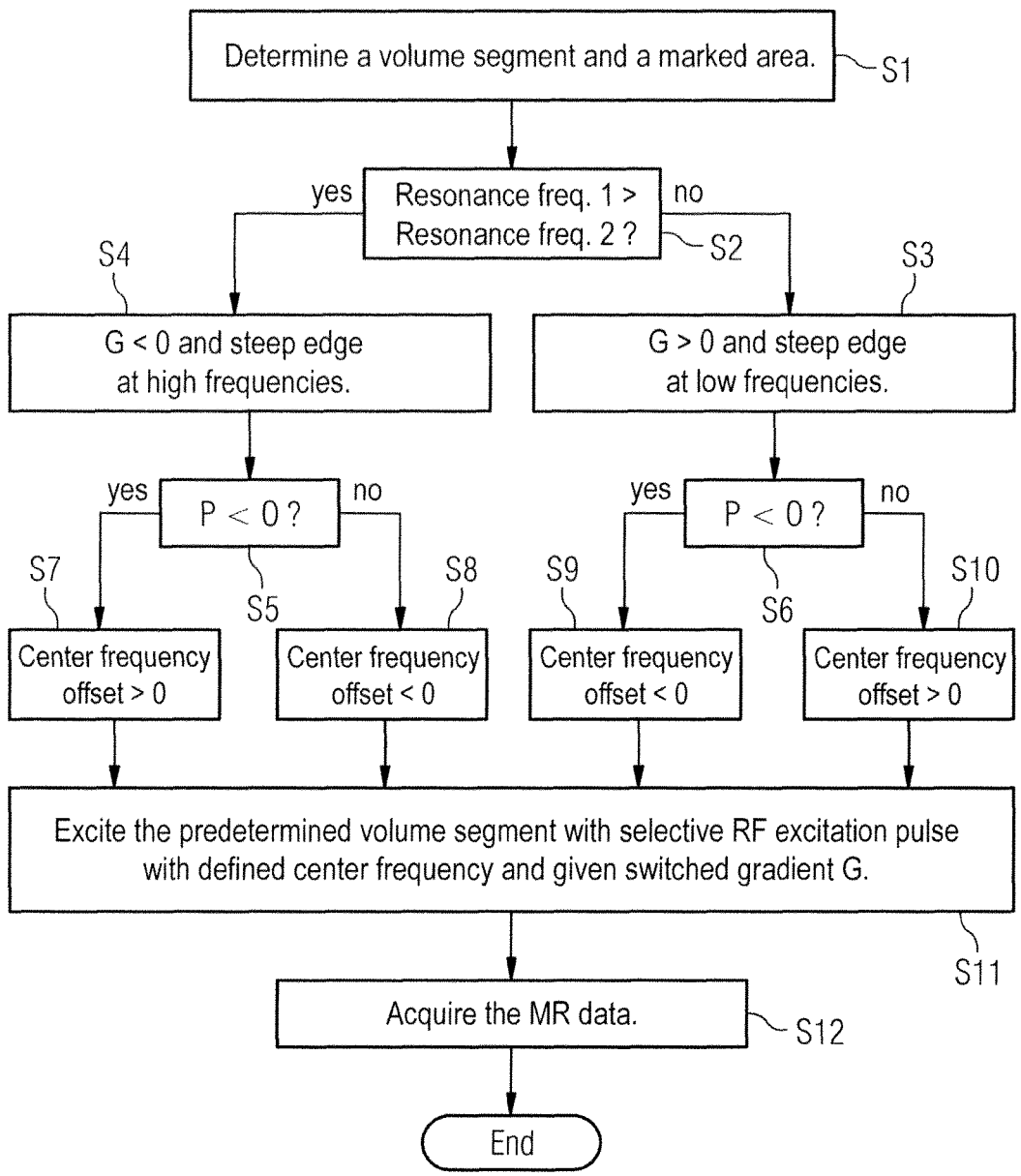
FIG. 10 shows an embodiment of the first method according to the invention in the form of a flowchart.

A program workflow diagram of the first method according to the invention, in which the predetermined volume segment 31 is selectively excited, is shown in FIG. 10.

The predetermined volume segment 31 and a marked area 40 are determined in a first step S1. The marked area 40 normally borders the predetermined volume segment 31 relative to a saturation volume segment 32. The marked area 40 can thereby also be determined automatically, and can possibly be corrected by an operator.

In a second Step S2 a decision is made as to whether the resonance frequency of the primary substance of interest (i.e. the resonance frequency 1) is higher or lower than the resonance frequency of secondary substances of interest. If the resonance frequency of the primary substance of interest is higher than the resonance frequency of the secondary substance of interest, the magnetic field gradient G has a negative algebraic sign relative to the normal vector 50, and the steep edge of the asymmetrical RF excitation pulse 42 lies at high frequencies, as is described in Step S4.

In Step S5, a check is subsequently made as to whether the center of the predetermined volume segment 31 is spaced apart from the isocenter IZ of the magnetic resonance system as viewed in the direction of the normal vector 50 or not. If the center of the predetermined volume segment is separated from the isocenter counter to the direction of the normal vector 50, the center frequency offset is set to be positive (Step S7), and otherwise is set to be negative (Step S8).

Contrarily, if it is detected in the second Step S2 that the resonance frequency of the primary substance of interest is lower than the resonance frequency of the secondary substance of interest, the magnetic field gradient G points in the same direction as the normal vector 50 (i.e. the magnetic field gradient G has a positive algebraic sign) and the steep edge of the asymmetrical RF excitation pulse 42 lies at low frequencies (as is described in Step S3).

In Step S6, a check is made (as in Step S5) as to whether the center of the predetermined volume segment is situated away from the isocenter as considered in the direction of the normal vector 50. If the center of the predetermined volume segment 31 is spaced away from the isocenter counter to the direction of the normal vector 50, the center frequency offset is adjusted negatively (Step S9) and otherwise positively (Step S10).

With the corresponding selection of the magnetic field gradient G, the position of the steep edge of the RF excitation pulse 42 and the center frequency offset, in Step S11 the predetermined volume segment is now excited and the MR data are acquired in the following Step S12.

If—instead of an asymmetrical RF excitation pulse 42—a symmetrical RF excitation pulse 41 is used with in the first method according to the invention, only Steps S3 and S4 change since then only the direction (the algebraic sign) of the magnetic field gradient G is adjusted in these steps, since a symmetrical RF excitation pulse has no steep edge in comparison to the other edge. (In a symmetrical RF excitation pulse, the edge present at the low frequencies is just as steep (flat) as the edge present at the high frequencies.)

In the flow chart shown in FIG. 10, it is apparent that the direction of the magnetic field gradient is not dependent on the position (the center) of the predetermined volume segment 31 relative to the isocenter, but rather only on whether the resonance frequency of the primary substance of interest is higher than the resonance frequency of the secondary substance of interest.

The flow chart of the second method according to the invention that is shown in FIG. 11 is identical in many steps to the flow chart shown in FIG. 10. Therefore, in the following only the difference of the flow chart of the second method according to the invention is explained in comparison to the flow chart in FIG. 10.

In the second method according to the invention, Step S1 also includes the determination of a saturation volume segment 32 which adjoins the marked area 40 at the predetermined volume segment 31.

In Steps S3' and S4', the steep edge of the asymmetrical RF excitation pulse 42 lies on the other side of the frequency spectrum in comparison to the flow chart of FIG. 10. Therefore, the steep edge of the RF excitation pulse 42 lies at low frequencies for the case that the resonance frequency of the primary substance of interest is higher than the resonance frequency of the secondary substance of interest, while it lies at high frequencies in the other case.

In Step S11' the saturation volume segment 32 is excited, for which the correspondingly designed asymmetrical RF excitation pulse 42 is used given correspondingly switched magnetic field gradients G. The excitation of the predetermined volume segment 31 takes place in a separate step S13.

It is again noted that the first method according to the invention and the second method according to the invention can also be used together. In this case, the RF excitation pulse to excite the predetermined volume segment 31 is determined according to the flow chart in FIG. 10, and the RF excitation pulse to excite the saturation volume segment 32 is determined according to the flow chart in FIG. 11.

The following explains how the determination of the marked area can be automated in order to further reduce the scope of necessary interactions by the user to define the marked area, whereby the workflow is facilitated and the duration of the planning of an examination is reduced.

For example, by means of heuristic methods it can be established which side of the saturation volume segment 31 or the predetermined volume segment 32 should presumably correspond to the marked area 40. The marked area 40 that is so determined is adopted as a type of presetting and shown to the user. The user can now monitor the attitude of the marked area 40 and possibly vary this attitude (and also the shape) of the marked area.

According to the invention, the following procedures exist for the algorithms of the determination of the marked area 40:

According to a first variant, the position of the saturation volume segment 32 relative to the predetermined volume segment 31 is taken into account. According to this first variant, the border or edge of the saturation volume segment 32 that faces towards the predetermined volume segment 31 is defined as a marked area (edge) 40. During a further planning of the measurement, an automatic adaptation of this procedure can then take place given a displacement of the predetermined volume segment or, respectively, the examination region by the user.

According to a second variant, information from automatic anatomical registration methods is used to determine the marked area 40. Algorithms are used that can identify and adjust the anatomical information in the image on the basis of landmarks or atlases. With the use of these methods or algorithms, the shape, the attitude and the orientation of the marked area of the saturation volume segment and/or predetermined volume segment can be established automatically. This variant is thus suitable for both a chemical shift and for shifts due to static or dynamic field disruptions.

According to a further variant according to the invention, information from previously determined distributions of static and/or dynamic field disruptions are used to determine the polarity of the magnetic field gradient (and position of the steep edge of an asymmetrical RF excitation pulse). For example, for each point of the saturation volume segment it is thereby determined whether a shift of the actual saturated volume into the predetermined volume segment (into the examination region) takes place or not. This determination is made for the parallel direction and antiparallel direction of the magnetic field gradient. For each of these directions, a mean (for example a weighted mean) can now be determined in that the amplitudes of those pixels which are incorrectly saturated in the predetermined volume segment can now be averaged accordingly. For example, the weighting can take place depending on the amplitude of these pixels or with a threshold in order to exclude noise from the evaluation. In the second case, to calculate the mean only those pixels are accordingly used whose amplitude is greater than the threshold. In each case, that direction of the magnetic field gradient is preferred in which the mean value is smallest.

In this variant the attitude of the marked area (edge) is also determined by the anatomy and/or the user. The optimal direction of the magnetic field gradient is determined depending on the occurrence or spatial distribution of the static and/or dynamic field disruptions. If field disruptions with a negative (positive) amplitude are present predominantly in proximity to the marked area, the magnetic field gradient of the saturation pulse (of the RF excitation pulse for saturation) is chosen to be negative (positive), whereby it is prevented that signals in the predetermined volume segment are suppressed.

In other words: the polarity of the magnetic field gradient and the attitude of the steep edge of the RF excitation pulse are chosen in the additional variant described in the preceding such that field disruptions lead to optimally few artifacts, while the polarity of the magnetic field gradient and the attitude of the steep edge of the RF excitation pulse are selected in the first and second method according to the invention such that the chemical shift leads to optimally few artifacts.

For presentation, an information about the partial regions that are presumably saturated in the predetermined volume segment or about the partial regions that are not excited in the predetermined volume segment 31 can advantageously be displayed to the user. This presentation can thereby take place on the basis of the previously determined static and/or dynamic field distributions, for example.

Although modifications and changes may be suggested by those skilled in the art, it is the intention of the inventors to embody within the patent warranted hereon all changes and modifications as reasonably and properly come within the scope of their contributions to the art.

We claim as our invention:

1. A method to acquire magnetic resonance (MR) data from a predetermined volume segment of an examination subject, comprising:

in a computerized processor, designating a marked area that demarcates a predetermined volume segment with respect to adjacent regions of an examination subject that adjoin the predetermined volume segment;

from said computerized processor, controlling operation of an MR data acquisition unit to excite nuclear spins in the examination subject by radiating a radio-frequency (RF) excitation pulse together with activation of a magnetic field gradient;

from said computerized processor, setting a center frequency of a frequency range of said RF excitation pulse, and a direction of said magnetic field gradient, dependent on resonant frequencies of nuclei that are present within said predetermined volume segment, so as to shift an actual volume of nuclear spins that are excited by said RF excitation pulse in a direction toward said marked area, starting from said predetermined volume segment; and from said computerized processor, operating said MR data acquisition unit to acquire MR data only from said actual volume segment, and making the acquired MR data available in electronic form at an output of said computerized processor.

2. A method as claimed in claim 1 wherein said predetermined volume segment comprises nuclei of a primary substance of interest and nuclei of a secondary substance of interest, the respective nuclei of said first and second substances of interest each having a resonant frequency, and comprising, in said processor in response to the determination of said marked area:

defining a vector that is parallel to said magnetic field gradient and that proceeds in a vector direction from said marked area toward said predetermined volume segment;

activating said magnetic field gradient in a direction opposite to said vector direction when the resonant frequency of said secondary substance of interest in the predetermined volume segment is lower than the resonant frequency of said primary substance of interest in the predetermined volume segment; and activating said magnetic field gradient in said vector direction when the resonant frequency of said secondary substance of interest in the predetermined volume segment is higher than the resonant frequency of the primary substance of interest in the predetermined volume segment.

3. A method as claimed in claim 2 comprising:

operating said MR data acquisition unit to radiate said RF excitation pulse as an asymmetrical Rf excitation pulse having first and second edges, one of which is steeper than the other and thereby forms a steeper edge;

radiating said RF excitation pulse with said steeper edge being present at low frequencies when the resonant frequency of the secondary substance of interest in the predetermined volume segment is lower than the resonant frequency of the primary substance of interest in the predetermined volume segment; and radiating said RF excitation pulse with the steeper edge present at high frequencies when the resonant frequency of the secondary substance of interest in the predetermined volume segment is higher than the resonant frequency of the primary substance of interest in the predetermined volume segment.

4. A method as claimed in claim 3 wherein said MR data acquisition unit has an isocenter, and wherein said method comprises, in said processor:

determining a middle of said predetermined volume segment;

determining a center frequency offset of said RF excitation pulse that is negative when the direction of the magnetic field gradient is opposite to said vector direction and when the middle of the predetermined volume segment is in the vector direction from the isocenter;

determining a center frequency offset of said RF excitation pulse that is positive when the direction of the magnetic field gradient is opposite to the vector direction and when the middle of the predetermined volume segment is opposite to said vector direction from said isocenter;

determining a center frequency offset of said RF excitation pulse that is positive when the direction of the magnetic field gradient is in said vector direction and when the middle of the predetermined volume segment is in the vector direction from the isocenter;

determining a center frequency offset of said RF excitation pulse that is negative when the direction of the magnetic field gradient is in said vector direction and when the middle of the predetermined volume segment is opposite to said vector direction from said isocenter; and adding said center frequency offset to the resonant frequency of the primary substance of interest in the predetermined volume segment in order to set the center frequency of the asymmetrical RF excitation pulse.

5. A method as claimed in claim 3 wherein said MR data acquisition unit has an isocenter, and comprising, in said processor:

determining a middle of said predetermined volume segment;

determining a center frequency offset of said RF excitation pulse that is negative when the resonant frequency of the secondary substance of interest in the predetermined volume segment is lower than the resonant frequency of the primary substance of interest in the predetermined volume segment, and when the middle of the predetermined volume segment is in said vector direction from said isocenter;

determining a center frequency offset of said RF excitation pulse that is positive when the resonant frequency of the secondary substance of interest in the predetermined volume segment is lower than the resonant frequency of the primary substance of interest in the predetermined volume segment, and when the middle of the predetermined volume segment is opposite to said vector direction from said isocenter;

determining a center frequency offset of said RF excitation pulse that is positive when the resonant frequency of the secondary substance of interest in the predetermined volume segment is higher than the resonant frequency of the primary substance of interest in the predetermined volume segment, and when the middle of the predetermined volume segment is in the vector direction from said isocenter;

determining a center frequency offset of the RF excitation pulse that is negative when the resonant frequency of the secondary substance of interest in the predetermined volume segment is higher than the resonant frequency of the primary substance of interest in the predetermined volume segment, and when the middle of the predetermined volume segment is opposite to said vector direction from said isocenter; and adding said center frequency offset to the resonant frequency of the primary substance of interest in the predetermined volume segment in order to set the center frequency of the asymmetrical RF excitation pulse.

6. A method as claimed in claim 1 comprising graphically presenting said marked area at a visual display of said computerized processor in a form allowing manual modification of at least one of an orientation and a shape of said marked area.

7. A method as claimed in claim 1 comprising:

automatically detecting anatomical properties of said examination subject and providing an electronic signal representing the detected anatomical properties to the computerized processor an input signal; and in said computerized processor, automatically determining said marked area dependent on the detected anatomical properties.

8. A method to acquire magnetic resonance (MR) data from a predetermined volume segment of an examination subject, comprising:

in a computerized processor, designating a marked area that demarcates a predetermined volume segment with respect to adjacent regions of an examination subject that adjoin the predetermined volume segment;

from said computerized processor, controlling operation of an MR data acquisition unit to selectively saturate nuclear spins in the examination subject by radiating a radio-frequency (RF) excitation pulse together with activation of a magnetic field gradient;

from said computerized processor, setting a center frequency of a frequency range of said RF excitation pulse, and a direction of said magnetic field gradient, dependent on resonant frequencies of nuclei that are present within said predetermined volume segment, so as to shift an actual saturation volume of nuclear spins that are saturated by said RF excitation pulse in a direction away from said marked area, starting from said predetermined volume segment; and from said computerized processor, operating said MR data acquisition unit to acquire MR data from said predetermined volume segment, and making the acquired MR data available in electronic form at an output of said computerized processor.

9. A method as claimed in claim 8 wherein said predetermined volume segment comprises nuclei of a primary substance of interest and nuclei of a secondary substance of interest, the respective nuclei of said first and second substances of interest each having a resonant frequency, and comprising, in said processor in response to the determination of said marked area:

defining a vector that is parallel to said magnetic field gradient and that proceeds in a vector direction from said marked area toward said predetermined volume segment;

activating said magnetic field gradient in a direction opposite to said vector direction when the resonant frequency of said secondary substance of interest in the predetermined volume segment is lower than the resonant frequency of said primary substance of interest in the predetermined volume segment; and activating said magnetic field gradient in said vector direction when the resonant frequency of said secondary substance of interest in the predetermined volume segment is higher than the resonant frequency of the primary substance of interest in the predetermined volume segment.

10. A method as claimed in claim 9 comprising:

operating said MR data acquisition unit to radiate said RF excitation pulse as an asymmetrical Rf excitation pulse having first and second edges, one of which is steeper than the other and thereby forms a steeper edge;

radiating said RF excitation pulse with said steeper edge being present at high frequencies when the resonant frequency of the secondary substance of interest in the predetermined volume segment is lower than the resonant frequency of the primary substance of interest in the predetermined volume segment; and radiating said RF excitation pulse with the steeper edge present at low frequencies when the resonant frequency of the secondary substance of interest in the predetermined volume segment is higher than the resonant frequency of the primary substance of interest in the predetermined volume segment.

11. A method as claimed in claim 10 wherein said MR data acquisition unit has an isocenter, and wherein said method comprises, in said processor:

determining a middle of said saturation volume segment;

determining a center frequency offset of said RF excitation pulse that is negative when the direction of the magnetic field gradient is opposite to said vector direction and when the middle of the saturation volume segment is in the vector direction from the isocenter;

determining a center frequency offset of said RF excitation pulse that is positive when the direction of the magnetic field gradient is opposite to the vector direction and when the middle of the saturation volume segment is opposite to said vector direction from said isocenter;

determining a center frequency offset of said RF excitation pulse that is positive when the direction of the magnetic field gradient is in said vector direction and when the middle of the saturation volume segment is in the vector direction from the isocenter;

determining a center frequency offset of said RF excitation pulse that is negative when the direction of the magnetic field gradient is in said vector direction and when the middle of the saturation volume segment is opposite to said vector direction from said isocenter; and adding said center frequency offset to the resonant frequency of the primary substance of interest in the predetermined volume segment in order to set the center frequency of the asymmetrical RF excitation pulse.

12. A method as claimed in claim 10 wherein said MR data acquisition unit has an isocenter, and comprising, in said processor:

determining a middle of said saturation volume segment;

determining a center frequency offset of said RF excitation pulse that is negative when the resonant frequency of the secondary substance of interest in the predetermined volume segment is lower than the resonant frequency of the primary substance of interest in the predetermined volume segment, and when the middle of the saturation volume segment is in said vector direction from said isocenter;

determining a center frequency offset of said RF excitation pulse that is positive when the resonant frequency of the secondary substance of interest in the predetermined volume segment is lower than the resonant frequency of the primary substance of interest in the predetermined volume segment, and when the middle of the saturation volume segment is opposite to said vector direction from said isocenter;

determining a center frequency offset of said RF excitation pulse that is positive when the resonant frequency of the secondary substance of interest in the predetermined volume segment is higher than the resonant frequency of the primary substance of interest in the predetermined volume segment, and when the middle of the saturation volume segment is in the vector direction from said isocenter;

determining a center frequency offset of the RF excitation pulse that is negative when the resonant frequency of the secondary substance of interest in the predetermined volume segment is higher than the resonant frequency of the primary substance of interest in the predetermined volume segment, and when the middle of the saturation volume segment is opposite to said vector direction from said isocenter; and adding said center frequency offset to the resonant frequency of the primary substance of interest in the predetermined volume segment in order to set the center frequency of the asymmetrical RF excitation pulse.

13. A method as claimed in claim 8 comprising graphically presenting said marked area at a visual display of said computerized processor in a form allowing manual modification of at least one of an orientation and a shape of said marked area.

14. A method as claimed in claim 8 comprising:

automatically detecting anatomical properties of said examination subject and providing an electronic signal representing the detected anatomical properties to the computerized processor an input signal; and in said computerized processor, automatically determining said marked area dependent on the detected anatomical properties.

15. A magnetic resonance (MR) system to acquire MR data from a predetermined volume segment of an examination subject, said MR system comprising:

an MR data acquisition unit;

a computerized processor configured to designate a marked area that demarcates a predetermined volume segment with respect to adjacent regions of an examination subject that adjoin the predetermined volume segment;

said computerized processor being configured to control operation of said MR data acquisition unit to excite nuclear spins in the examination subject by radiating a radio-frequency (RF) excitation pulse together with activation of a magnetic field gradient;

said computerized processor being configured to set a center frequency of a frequency range of said RF excitation pulse, and a direction of said magnetic field gradient, dependent on resonant frequencies of nuclei that are present within said predetermined volume segment, so as to shift an actual volume of nuclear spins that are excited by said RF excitation pulse in a direction toward said marked area, starting from said predetermined volume segment; and said computerized processor being configured to operate said MR data acquisition unit to acquire MR data only from said actual volume segment, and to make the acquired MR data available in electronic form at an output of said computerized processor.

16. A magnetic resonance (MR) system to acquire MR data from a predetermined volume segment of an examination subject, said MR system comprising:

an MR data acquisition unit;

a computerized processor configured to designate a marked area that demarcates a predetermined volume segment with respect to adjacent regions of an examination subject that adjoin the predetermined volume segment;

said computerized processor being configured to control operation of said MR data acquisition unit to selectively saturate nuclear spins in the examination subject by radiating a radio-frequency (RF) excitation pulse together with activation of a magnetic field gradient;

said computerized processor being configured to set a center frequency of a frequency range of said RF excitation pulse, and a direction of said magnetic field gradient, dependent on resonant frequencies of nuclei that are present within said predetermined volume segment, so as to shift an actual saturation volume of nuclear spins that are saturated by said RF excitation pulse in a direction away from said marked area, starting from said predetermined volume segment; and said computerized processor being configured to operate said MR data acquisition unit to acquire MR data only from said predetermined volume segment, and to make the acquired MR data available in electronic form at an output of said computerized processor.

17. A non-transitory, computer-readable data storage medium encoded with programming instructions, said data storage medium being loaded into a computerized processor of a magnetic resonance (MR) system that also comprises an MR data acquisition unit, said programming instructions causing said computerized processor to:

designate a marked area that demarcates a predetermined volume segment with respect to adjacent regions of an examination subject that adjoin the predetermined volume segment;

control operation of said MR data acquisition unit to excite nuclear spins in the examination subject by radiating a radio-frequency (RF) excitation pulse together with activation of a magnetic field gradient;

set a center frequency of a frequency range of said RF excitation pulse, and a direction of said magnetic field gradient, dependent on resonant frequencies of nuclei that are present within said predetermined volume segment, so as to shift an actual volume of nuclear spins that are excited by said RF excitation pulse in a direction toward said marked area, starting from said predetermined volume segment; and operate said MR data acquisition unit and to acquire MR data only from said actual volume segment, and making the acquired MR data available in electronic form at an output of said processor.

18. A non-transitory, computer-readable data storage medium encoded with programming instructions, said data storage medium being loaded into a computerized processor of a magnetic resonance (MR) system that also comprises an MR data acquisition unit, said programming instructions causing said computerized processor to:

designate a marked area that demarcates a predetermined volume segment with respect to adjacent regions of an examination subject that adjoin the predetermined volume segment;

control operation of said MR data acquisition unit to selectively saturate nuclear spins in the examination subject by radiating a radio-frequency (RF) excitation pulse together with activation of a magnetic field gradient;

set a center frequency of a frequency range of said RF excitation pulse, and a direction of said magnetic field gradient, dependent on resonant frequencies of nuclei that are present within said predetermined volume segment, so as to shift an actual saturation volume of nuclear spins that are saturated by said RF excitation pulse in a direction away from said marked area, starting from said predetermined volume segment; and operate said MR data acquisition unit to acquire MR data from said predetermined volume segment, and make the acquired MR data available in electronic form at an output of said processor.

* * * * *